(12) United States Patent
Ikeda et al.

(10) Patent No.: US 6,781,237 B2
(45) Date of Patent: Aug. 24, 2004

(54) WIRING-INCLUSIVE STRUCTURE AND FORMING METHOD THEREOF (75) Inventors: Masanobu Ikeda, Kawasaki (JP); Takashi Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 102 days.

(21) Appl. No.: 10/280,030

(22) Filed: Oct. 25, 2002

(65) Prior Publication Data

US 2003/0168743 A1 Sep. 11, 2003

(30) Foreign Application Priority Data

Mar. 6, 2002 (JP) ......................................... 2002-060774

(51) Int. Cl.⁷ .............................................. H01L 23/48
(52) U.S. Cl. ...................... 257/758; 257/210; 257/759; 257/760
(58) Field of Search ........................ 257/210, 758–760

(56) References Cited

U.S. PATENT DOCUMENTS

| | | | |
|---|---|---|---|
| 6,331,481 B1 * | 12/2001 | Stamper et al. ............. | 438/626 |
| 6,492,734 B2 * | 12/2002 | Watanabe ................... | 257/758 |
| 6,577,011 B1 * | 6/2003 | Buchwalter et al. ........ | 257/758 |
| 6,614,096 B2 * | 9/2003 | Kojima et al. .............. | 257/635 |
| 2001/0030369 A1 | 10/2001 | MacNeil et al. | |
| 2002/0020919 A1 | 2/2002 | Li et al. ...................... | 257/759 |
| 2002/0158337 A1 * | 10/2002 | Babich et al. ............... | 257/758 |
| 2002/0175415 A1 * | 11/2002 | Matsunaga .................. | 257/758 |

OTHER PUBLICATIONS

Patent Abstracts of Japan Publication No. 2001-244337 dated Sep. 7, 2001 Corresponds to U.S. patent application Publication No. 2001/0030369 A1.

* cited by examiner

Primary Examiner—David Nelms
Assistant Examiner—Andy Huynh
(74) Attorney, Agent, or Firm—Westerman, Hattori, Daniels & Adrian, LLP (57) ABSTRACT A wiring which is formed by filling a via hole and a wiring trench with Cu via a base film is formed by a damascene method. Thereafter, an SiC:H film is formed to cover an upper surface of the wiring. At this time, an N atom content thereof is controlled to be 8 (atm %) to 20 (atm %) by adding an N-containing gas at the time of forming the SiC:H film, thereby causing the film density of the SiC:H film to be 2.1 (g/cm³) or higher.

22 Claims, 13 Drawing Sheets

Correlation between film density and k value

FIG. 3

Correlation between stress drift and film density

FIG. 4A

K=5.7 Condition A
(Film density 2.42 g/cm3)

FIG. 4B

K=4.9 Condition B
(Film density 2.32 g/cm3)

FIG. 4C

K=4.2 Condition
(Film density 1.79 g/cm3)

FIG. 5A

TDDB TEST ON INTERLAYER INSULATION FILM

STRUCTURE AND CONDITION OF TEST
Cu ELECTRODE
TEST TEMPERATURE 200°C

STATE OF LEAK CURRENT

FIG. 6B

- LEAK CURRENT IS DECREASED AT THE BEGINNING OF VOLTAGE APPLICATION BUT, THEREAFTER, IS STABILIZED AT SUBSTANTIALLY FIXED VALUE

- AS INDICATION OF INITIAL LEAK CURRENT, CURRENT VALUE AFTER 0.1 SEC. IS DEFINED AS $i_0$.

- MEASUREMENT RANGE POSSIBLE ON WAFER LEVEL IS UP TO 2000 SEC.

FILM DENSITY IS INCREASED WHEN N CONCENTRATION IS INCREASED
→ RELIABILITY IS ENHANCED
  DIELECTRIC CONSTANT IS INCREASED AT THE SAME TIME
  (DEGRADATION IN PERFORMANCE)

N CONCENTRATION OF 8 TO 20 ATM% IS CONSIDERED TO BE PROPER FROM THE VIEWPOINT OF ENHANCEMENT IN RELIABILITY AND PERFORMANCE.

WIRING-INCLUSIVE STRUCTURE AND FORMING METHOD THEREOF

CROSS-REFERENCE TO RELATED APPLICATIONS

This application is based upon and claims priority of Japanese Patent Application No. 2002-060774, filed on Mar. 6, 2002, the contents being incorporated herein by reference.

BACKGROUND OF THE INVENTION

1. Field of the Invention

The present invention relates to a wiring-inclusive structure in which a wiring trench formed in an insulation film is filled with a conductive material having an easily diffusible property, especially, a Cu-containing metal material.

2. Description of the Related Art

As a semiconductor element becomes highly integrated and a chip size becomes smaller, microscopic formation of a wiring and a multilayered structure of wirings are acceleratedly promoted. In a logic device having such a multilayered wiring-inclusive structure, wiring delay is becoming one of dominant factors of signal delay of the device. The signal delay of the device is proportional to the product of a wiring resistance by a wiring capacity, and therefore, reduction in the wiring resistance and the wiring capacity is important to remedy the wiring delay.

In order to reduce this wiring resistance, it is being considered to form a wiring, using Cu which is a low resistant metal as its material. Here, since it is very difficult to form the wiring by patterning Cu, a so-called damascene method has been devised. In this damascene method, a wiring trench is formed in an insulation film and this wiring trench is filled with Cu to form the wiring. In the case when this damascene method is adopted, it is suitable to use a material with a low dielectric constant instead of conventionally used $SiO_2$ as the aforesaid insulation film in order to further reduce the wiring capacity.

As described above, Cu is highly prospective as a future wiring material since it is a low resistant metal, but on the other hand, it has a disadvantage of having an easily diffusible property to a generally used insulation material. Therefore, in a Cu wiring forming process by the damascene method, an SiN film having a function of Cu diffusion prevention and a function as an etching stopper is formed on a Cu wiring after the Cu wiring is formed in such a manner that Cu deposited on the insulation film is polished and removed by a CMP (Chemical Mechanical Polishing) method and it fills only the wiring trench in the insulation film.

However, since SiN has a relatively large dielectric constant of 7.0, a serious problem occurs that, even when a film with a low dielectric constant is used as the insulation film, the decrease in its dielectric constant is hindered by a fringe effect of SiN and an effective dielectric constant is not reduced.

SUMMARY OF THE INVENTION

The present invention is made in view of the above problem. It is an object of the present invention to suppress wiring delay and greatly reduce an effective dielectric constant of an insulation film in which the wiring is filled and formed, at the time of forming the wiring of a conductive material having an easily diffusible property to the insulation film, which is represented by Cu, by a damascene method and to thereby provide a highly reliable wiring-inclusive structure and a forming method thereof which respond to further microscopic formation of a semiconductor element in the near future.

As a result of assiduous studies, the inventor of the present invention has come up with various forms of the inventions described below.

A wiring-inclusive structure of the present invention is a wiring-inclusive structure which is so constituted that a wiring-shaped trench is formed in an insulation film provided above a substrate and the trench is filled with a conductive material having an easily diffusible property to the insulation film to form a wiring. Further, a diffusion preventive film which uses hydrogenated SiC as its material and whose film density is 2.1 (g/cm$^3$) or higher is provided to cover an upper surface of the wiring.

Another form of a wiring-inclusive structure of the present invention is a wiring-inclusive structure which is so constituted that a wiring-shaped trench is formed in an insulation film provided above a substrate and the trench is filled with a conductive material having an easily diffusible property to the insulation film to form a wiring. Further, a diffusion preventive film which uses hydrogenated SiC as its material and contains 8 (atm %) to 20 (atm %) of N atoms is provided to cover an upper surface of the wiring.

A forming method of a wiring-inclusive structure of the present invention comprises the steps of: forming at least a wiring-shaped trench in an insulation film; filling the trench with a conductive material having an easily diffusible property at least to the insulation film to form a wiring; and forming a diffusion preventive film which uses hydrogenated SiC as its material to cover an upper surface of the wiring and to have a film density of 2.1 (g/cm$^3$) or higher.

Another form of a forming method of a wiring-inclusive structure of the present invention comprises the steps of: forming at least a wiring-shaped trench in an insulation film; filling the trench with a conductive material having an easily diffusible property at least to the insulation film to form a wiring; and forming a diffusion preventive film which uses hydrogenated SiC as its material to cover an upper surface of the wiring. In this forming method, an N-containing gas is added into the diffusion preventive film in the step of forming the diffusion preventive film, and an N concentration in the diffusion preventive film is controlled to be 8 (atm %) to 20 (atm %).

DETAILED DESCRIPTION OF THE PREFERRED EMBODIMENTS

Basic Gist of Present Invention

To begin with, the basic gist of the present invention will be explained.

In replacement of an SiN film having a relatively high dielectric constant, a hydrogenated SiC (SiC:H) film formed by a plasma CVD method has recently been proposed as a Cu diffusion preventive film formed by a damascene method and covering an upper surface of a Cu wiring.

Figure 1:
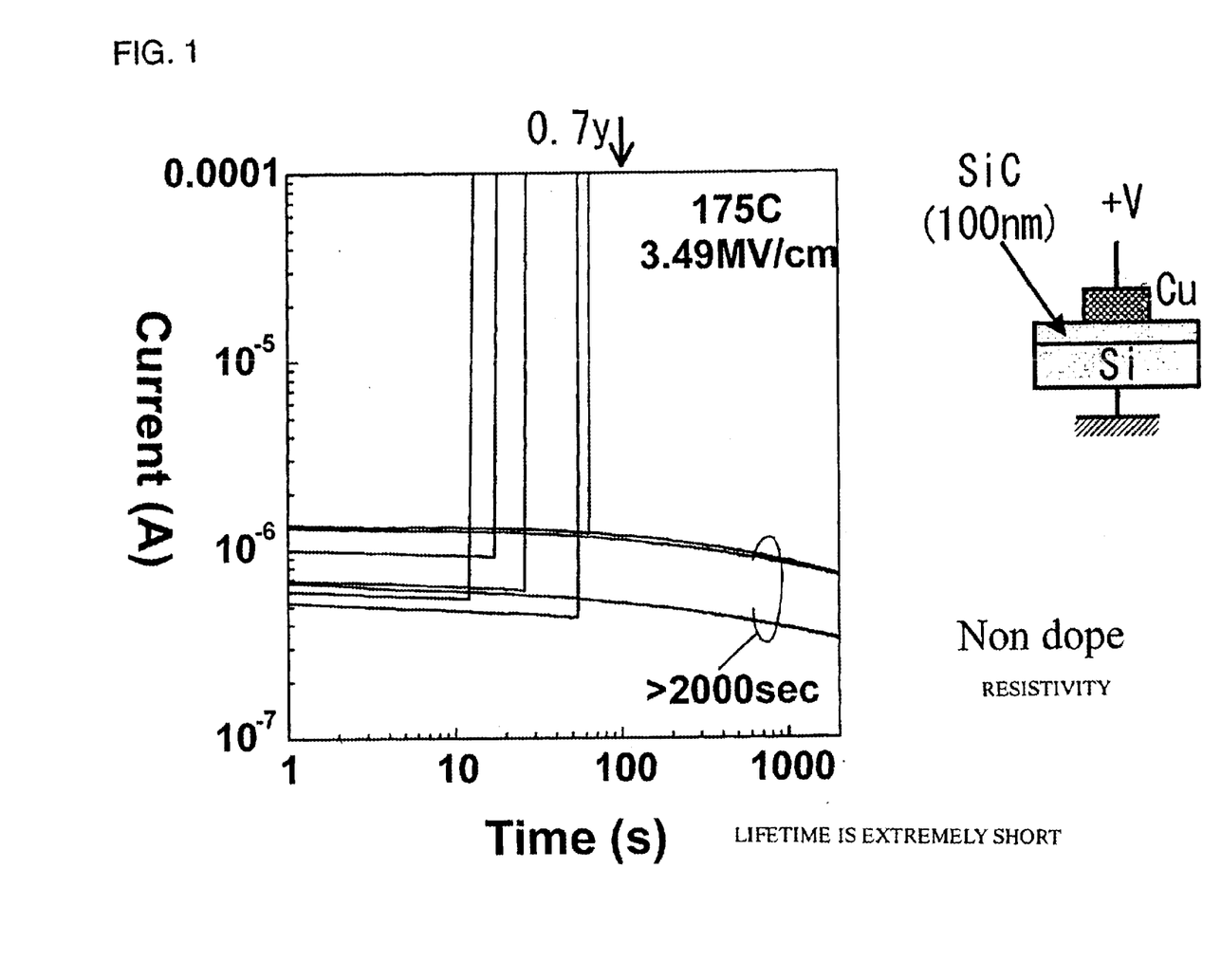
FIG. 1 is a schematic view showing a dielectric breakdown test of an ordinary SiC:H film.

It is a known fact, however, that the SiC:H film has a property of lacking insulation pressure resistance though it has a low dielectric constant compared with that of the SiN film. Concretely, as a result of a dielectric break-down test in which a SiC:H film is formed on a silicon substrate to be 100 nm in film thickness, a Cu electrode is formed on this SIC:H film, and a voltage is applied thereto, dielectric break-down occurs in the SIC:H film under the condition that the temperature is 175 (° C.) and the electric field is 3.75 (MV/cm), as shown in FIG. 1.

The inventor of the present invention has deduced that the property of the SiC:H film that it lacks the insulation pressure resistance is caused by a low film density of the formed SiC:H film, and based on this deduction, conducted each of the following tests in order to study a concrete method for improving the insulation pressure resistance while minimizing an adverse effect given to the SIC:H film.

[1] Correlation in SiC:H film between film density and dielectric constant (k value) in the case when film density is varied by adding N atoms First, the influence that the increase in the film density of the SIC:H film gives to the dielectric constant will be studied. In order to heighten the film density of the SiC:H film, addition of nitrogen (N) atoms into the film at the time of forming the SiC:H film is effective.

Figure 2:
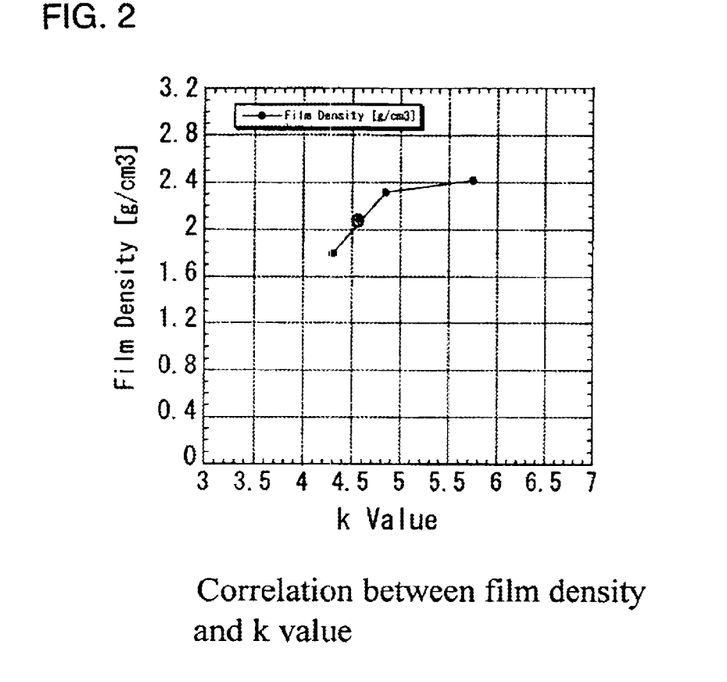
FIG. 2 is a characteristic chart showing the correlation between a film density and a dielectric constant in the SiC:H film.

As shown in FIG. 2, when SIC:H films having different film densities are formed, each having a film thickness of 200 nm, on a silicon substrate and the dielectric constant of each of them is examined, it has turned out that, though the dielectric constant also shows an increasing tendency with an increase in the film density, the ratio of the increase in the latter to that in the former is small. In other words, it has been confirmed that the dielectric constant is not increased very much even when the film density of the SiC:H film is heightened.

[2] Correlation between film stress drift and film density in SiC:H film

Next, the stability of the film stress over time when the film density of the SiC:H film is controlled will be studied.

Here, after an SiC:H film is formed on a silicon substrate to be 200 nm in film thickness similarly to [1], it is left in the atmosphere for one week. Then, how the film stress drifts from the time of the film deposition to the time after it is left for one week is examined.

Figure 3:
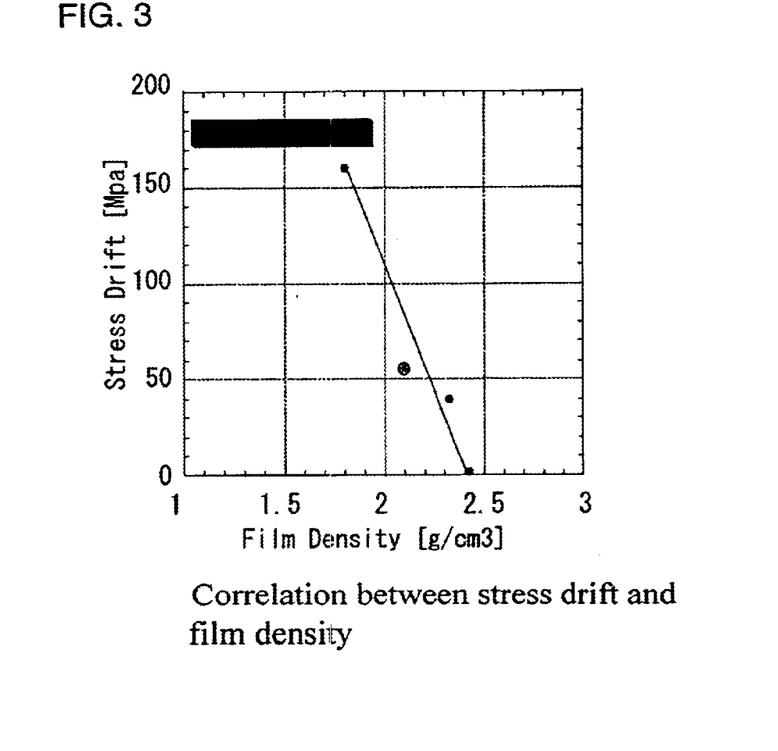
FIG. 3 is a characteristic chart showing the correlation between the film density and a film stress drift in the SiC:H film when it is left in the atmosphere for one week.

FIG. 3 is a characteristic chart showing the correlation in the SiC:H film between the film density and the film stress drift after it is left in the atmosphere for one week.

According to FIG. 3, the film stress drift is reduced with the increase in the film density and the stress drift is not seen when the film density becomes 2.1 (g/cm$^3$). In other words, it is seen that in a dense SIC:H film formed to have a film density of 2.1 (g/cm$^3$) or higher, the film stress is stabilized even when this SiC:H film is left in the atmosphere for a long time.

Note that, in each of the tests [1] and [2], a trimethylsilane (3MS) gas is used as a source gas of the SIC:H film and $NH_3$ is used as an added N-containing gas in order to obtain the film density of 2.1 (g/cm$^3$) for the SiC:H film. It is suitable as typical film-forming conditions for obtaining the film density of 2.1 (g/cm$^3$) that a flow rate of 3MS is 150 (cc/min), an RF power (13.56 MHz) is 300 (W), a substrate temperature is 350 (° C.), a flow rate of $NH_3$ which is the added gas is 100 (cc/min) or higher, and an atmospheric pressure is $2.7 \times 10^2$ (Pa) (2 Torr). In this case, a tetramethylsilane (4 MS) gas may be used as the source gas of the SiC:H film. Further, the use of $N_2$ as the added gas also produces a similar effect.

[3] Correlation between thermal desorption spectroscopy (TDS) characteristic and film density in SiC:H film Next, absorption stability of the added N-containing gas into the film at the time of forming the SiC:H film will be studied.

Here, an SiC:H film is formed on a silicon substrate to be 430 nm in film thickness, and a substrate temperature is varied from a room temperature to 700° C. Then, a degas characteristic is examined by the TDS. 2, 12, 15, 16, 17, 18, 28, and 44 among M/e ( ) are focused on in this TDS test.

Figure 4A:
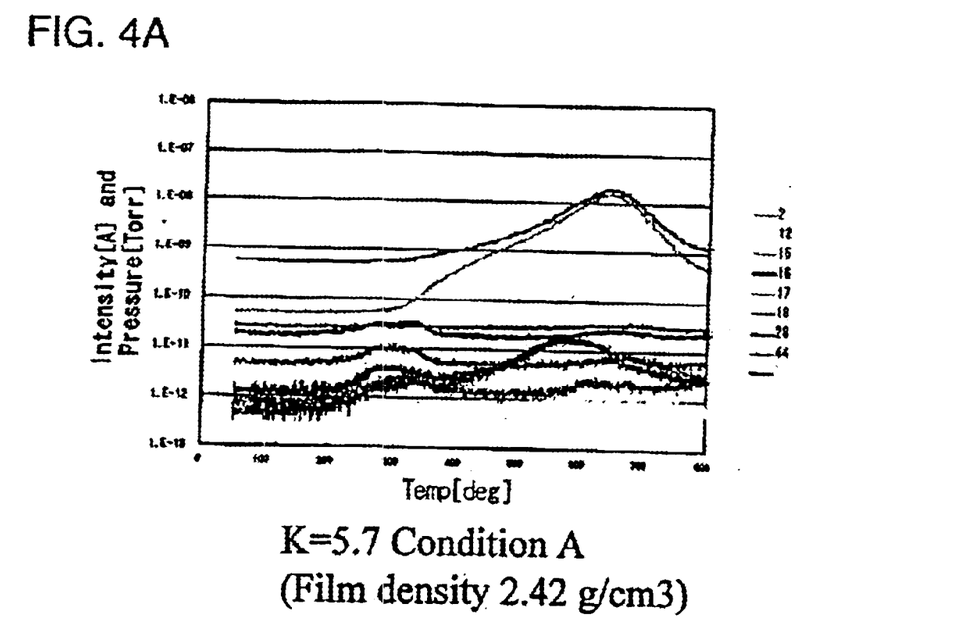
FIG. 4A, FIG. 4B, and FIG. 4C are characteristic charts showing a degas characteristic of the SiC:H film under each film-forming condition.
Figure 4B:
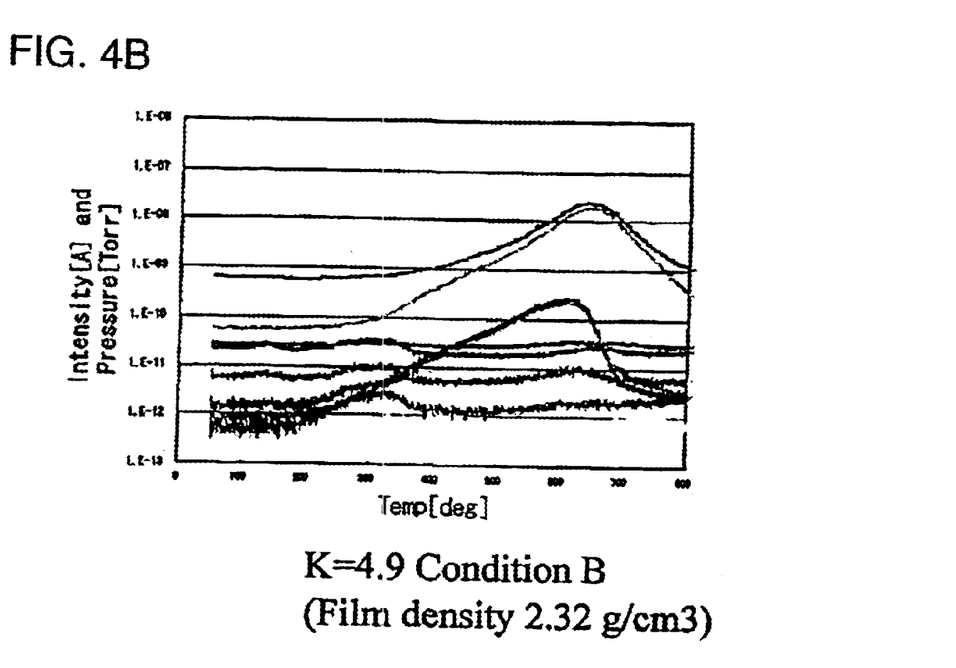
Figure 4C:
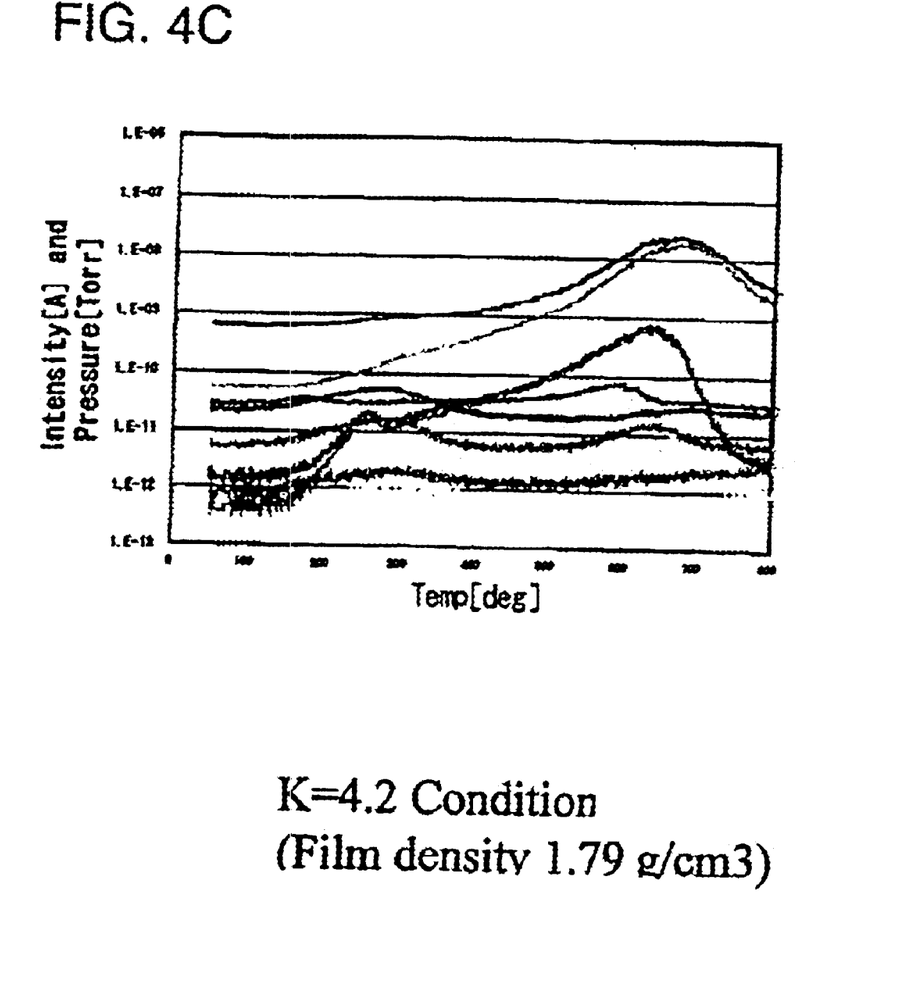

FIG. 4A, FIG. 4B, and FIG. 4C are characteristic charts showing a degas characteristic of the SiC:H film under each film-forming condition.

According to FIG. 4A, FIG. 4B, and FIG. 4C, when a degas amount of M/e=16 at 400° C. is focused on, it is $4.0 \times 10^{-9}$ (Pa) ($3.0 \times 10^{-11}$ (Torr)) when the film density is 1.79 (g/cm$^3$), $2.4 \times 10^{-9}$ (Pa) ($1.8 \times 10^{-11}$ (Torr)) when the film density is 2.32 (g/cm$^3$), and $3.3 \times 10^{-10}$ (Pa) ($2.5 \times 10^{31\ 12}$ (Torr)) when the film density is 2.42 (g/cm$^3$). Therefore, it is apparent that the degas amount decreases as the film density increases. It can be inferred from the above that, in the process of the film forming, the film becomes a dense SiC:H film into which a substance whose bonding therewith is week is not easily taken so that an amount of the gas absorbed therein becomes small even when it is left, thereby bringing about stability.

[4] Correlation between lifetime of time dependent dielectric break-down (TDDB) and film density in SiC:H film Next, pressure resistance reliability when the film density of the SiC:H film is controlled will be studied.

Figure 5A:
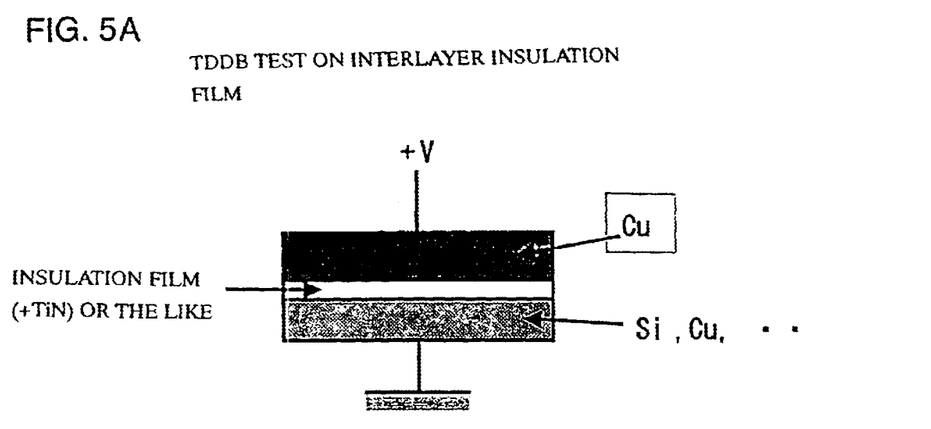
FIG. 5A, FIG. 5B, and FIG. 5C are schematic views showing the principle of a TDDB test
Figure 5B:
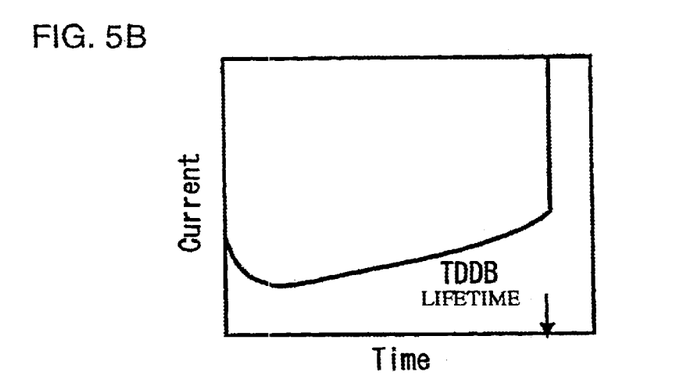
Figure 5C:
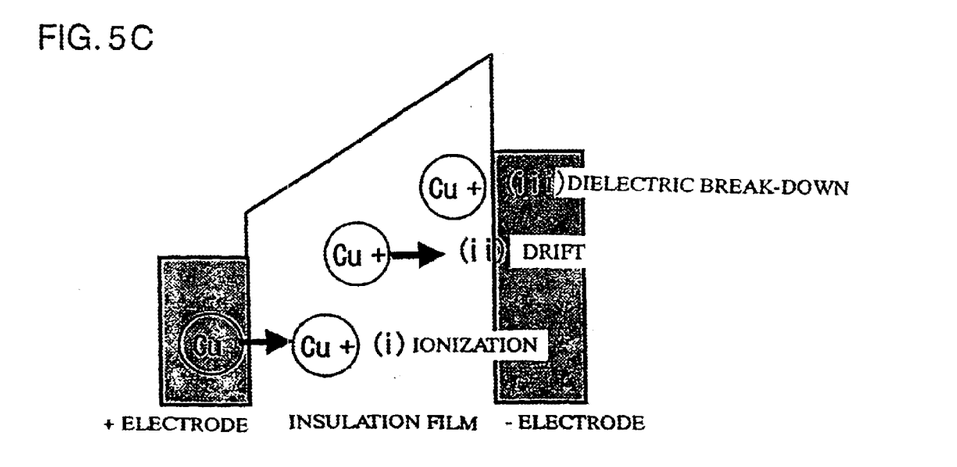

FIG. 5A, FIG. 5B, and FIG. 5C are schematic views showing the principle of a TDDB test.

As shown in FIG. 5A, after an insulation film is deposited on a silicon substrate (or a Cu film or the like), Cu for electrode is deposited on this insulation film by vacuum deposition and a voltage is applied thereto with a formed Cu electrode being a + electrode and the silicon substrate being a ground. When the voltage is applied, ionized Cu is discharged into the insulation film from the + Cu electrode as shown in FIG. 5C. The Cu ions absorbed into the insulation film drift from the + electrode to a − electrode due to an electric field occurring between the electrodes and finally reach the − electrode to cause dielectric break-down. How a leakage current changes over time is shown in FIG. 5B. The time when the leakage current greatly increases is the time when the lifetime of the insulation film ends due to the dielectric break-down.

Figure 6A:
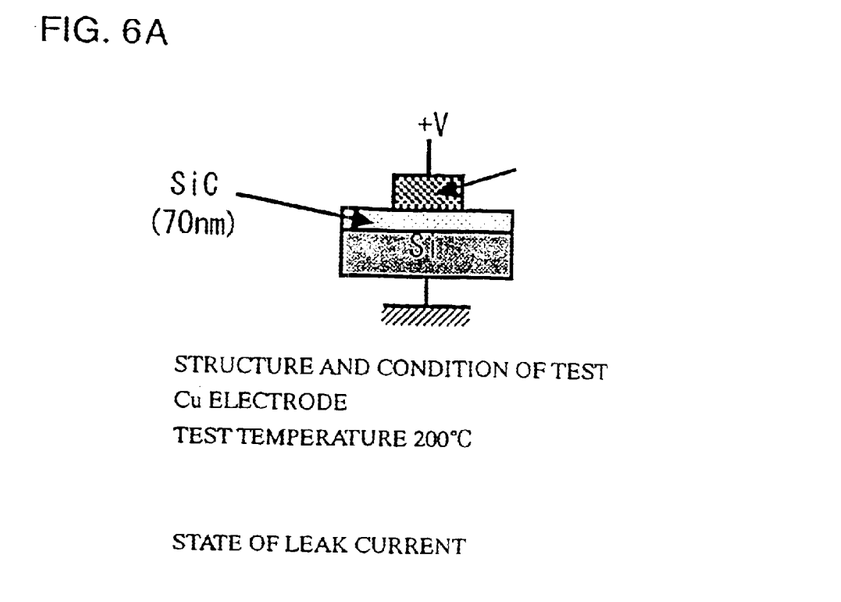
FIG. 6A and FIG. 6B are schematic views in the case when the TDDB test is applied to the SiC:H film.
Figure 6B:
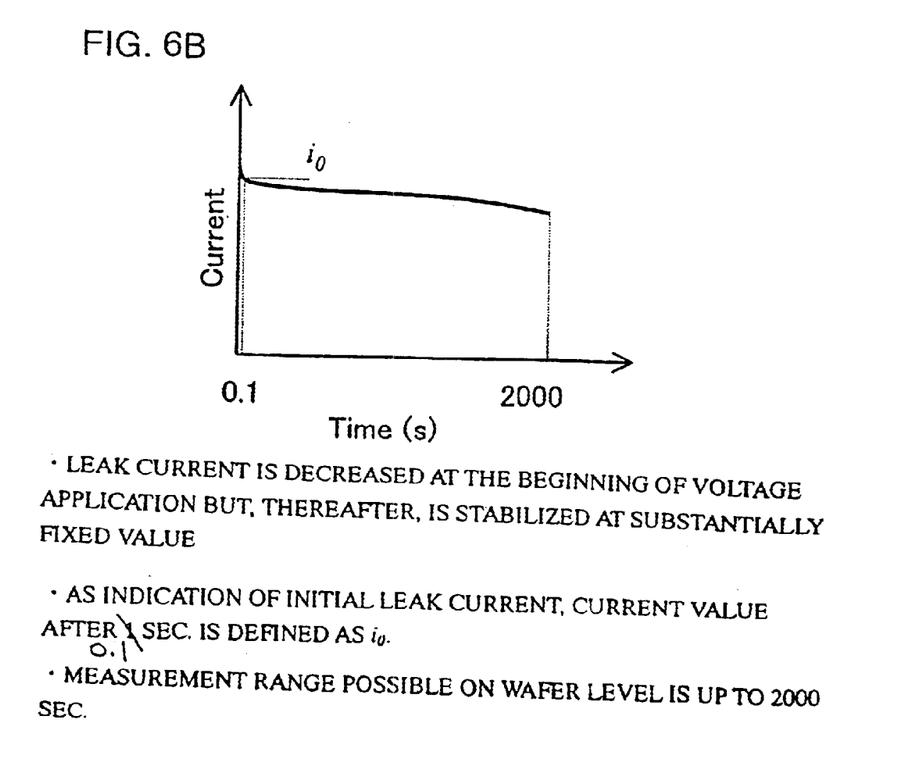

FIG. 6A and FIG. 6B are schematic views when the aforesaid TDDB test is applied to the SiC:H film. The outlined structure of a sample used in the TDDB test is shown in FIG. 6A. This sample is formed in such a manner that an SiC:H film is formed on a silicon substrate to be 70 nm in film thickness, and thereafter, a Cu electrode is formed on the SiC:H film by vacuum deposition. The size of the Cu electrode is 0.15 mmϕ and the measurement is made using a prober with a stage temperature set at 200° C. At the time of the measurement, a + voltage is applied to the Cu electrode as shown in FIG. 6B. In this case, the leakage current decreases at the beginning of the voltage application but is stabilized at a substantially fixed value thereafter. As an indication of an initial leakage current, a current value after 0.1 second passes is defined as $i_0$ and a range of the measurement possible on a wafer level is defined up to approximately 2000 seconds.

The test result is summarized in the following Table 1

TABLE 1

Correlation between Measured Value of $i_0$ (Unit:A) and MTF

|  | V(V) | E(MV/cm) | 2.42 g/cm³ (k = 5.7) | 2.32 g/cm³ (k = 4.9) | 1.79 g/cm³ (k = 4.2) |
|---|---|---|---|---|---|
| $i_0$ | 1 | 0.14 |  |  | 1.8E−09 |
|  | 5 | 0.71 | 3.0E−10 | 1.9E−10 | 6.0E−08 |
|  | 10 | 1.43 | 1.4E−09 | 1.6E−09 | 2.7E−06 |
|  | 21 | 3.00 | 5.0E−09 | 3.8E−07 | NG |
| MTF | 21 | 3.00 | >>2000 sec | >2000 sec | NG |

*) calculated on assumption that SiC is 70 nm thick

The SiC:H film whose film density is 2.42 (g/cm³) shows such a result that, even when an electric field of 3 (MV/cm) is applied, there is a small amount of a leakage current and mean time to failure (MTF) far exceeds 2000 seconds which is a limit on the wafer level. On the other hand, as for the SiC:H film whose film density is 1.79 (g/cm³), the leakage current exceeds 100 μA when the electric field of 3 (MV/cm) is applied thereto. Since the leakage current of approximately >1 (μ/cm²) is adopted as an indication of the lifetime in the TDDB test, the leakage current occurring even when the electric field of 1.4 (MV/cm) is applied corresponds to μA order, which is extremely large. Further, the SiC:H film whose film density is 2.32 (g/cm³) shows an intermediate physicality between physicalities in the cases of the film density of 2.42 (g/cm³) and 1.79 (g/cm³).

Further, a sample having an SiC:H film whose film density is 2.1 (g/cm³) is prepared by adding $NH_3$ as an added gas when the SIC:H film is formed, and a similar test to the above is conducted also on this sample. The result of this test is summarized in the following Table 2.

TABLE 2

| Film Density [g/cm³] | Stress Drift [MPa] | k value | Degas amount of M/e = 16 at 400° C. [Torr] | Lifetime of TDDB at 3 MV/cm [sec] |
|---|---|---|---|---|
| 1.79 | 160 | 4.2 | 3.00E−11 | NG |
| 2.10 | 40 | 4.6 | 2.00E−11 | >2000 |
| 2.32 | 40 | 4.9 | 1.80E−11 | >2000 |
| 2.42 | 2 | 5.8 | 2.50E−12 | >>2000 |

It is seen from Table 2 that, when the SiC:H film is formed to be 2.1 (g/cm³) or higher in film density by controlling the amount of the added gas, demands for reducing the dielectric constant and securing electric reliability are both satisfied sufficiently.

[5] Correlation between added amount of N atoms and film density in SiC:H film

As described above, it has been found for the first time here that the addition of the N-containing gas increases the film density of the SiC:H film and improves the insulation pressure resistance. Therefore, a proper addition range of the added N-containing gas will be studied next.

As explained in [1], the increase in the film density of the SiC:H film causes the increase in the dielectric constant. As a method of increasing the film density, the present invention adopts the addition of the N atoms at the time of forming the SiC:H film. Therefore, it is necessary to examine the correlation of the added amount of the N atoms with the dielectric constant and with the film density.

Figure 7A:
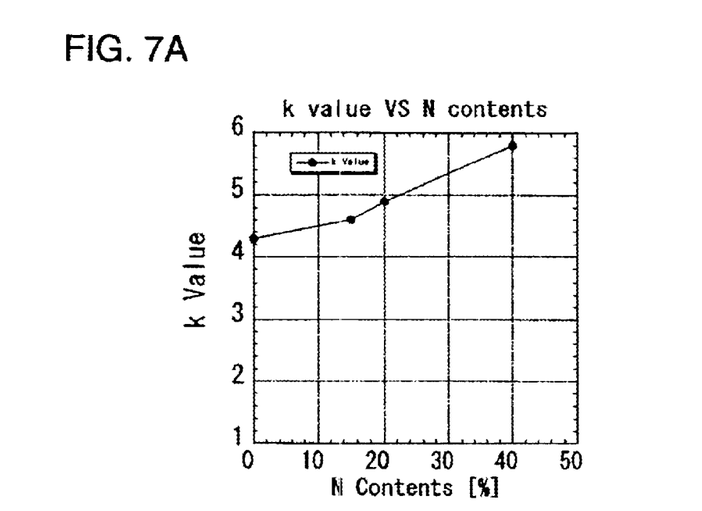
FIG. 7A and FIG. 7B are characteristic charts showing the correlation between an added amount of N atoms and a dielectric constant, and between an added amount of the N atoms and a film density respectively.
Figure 7B:
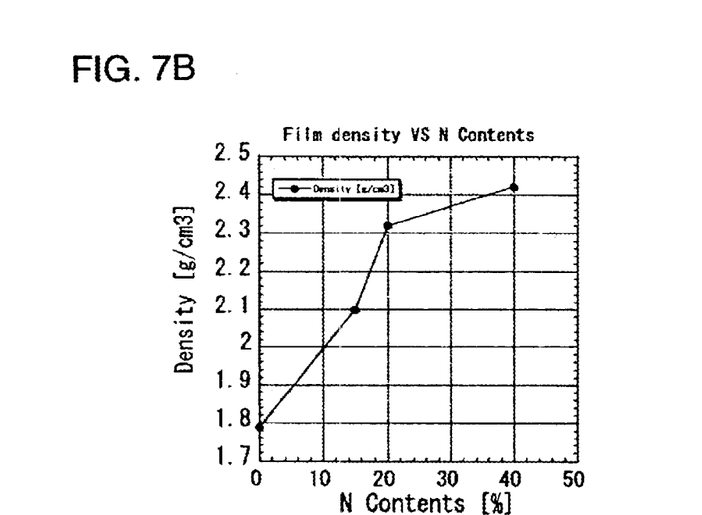

FIG. 7A is a characteristic chart showing the correlation between the N atom content of the SIC:H film and the dielectric constant and FIG. 7B is a characteristic chart showing the correlation between the N atom content of the SIC:H film and the film density.

As shown in FIG. 7A, with the increase in the N atom content, the dielectric constant also shows an increasing tendency. However, as for the film density, when the N atom content is 20 (atm %) or higher, saturation occurs (FIG. 7B). An upper limit of the N atom content of the SiC:H film with which it can maintain its function as a reliable Cu diffusion preventive film with a low dielectric constant can be estimated to be 20 (atm %). Meanwhile, as shown in FIG. 7B, in order to secure the film density of 2.1 (g/cm³) or higher, the N atom content needs to be approximately 15 (atm %) or higher. In view of the demand for sufficiently securing the insulation pressure resistance, a lower limit of the N atom content can be estimated to be 8 (atm %). From the above study, the N atom content of the SIC:H film, namely, a proper addition range of the added N-containing gas is from 8 (atm %) to 20 (atm %). When this range is satisfied, improvement in the insulation pressure resistance is realized while minimizing an adverse effect given to the SiC:H film.

Figure 8:
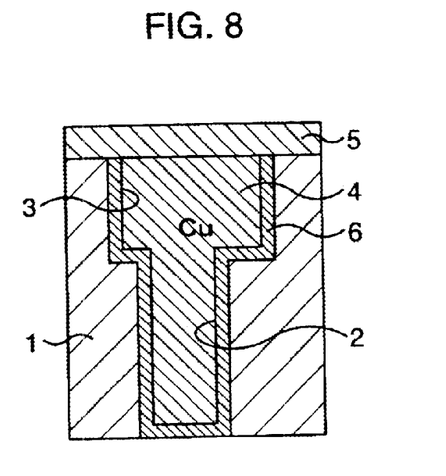
FIG. 8 is a schematic sectional view showing the essential constitution of a wiring-inclusive structure in this embodiment.

Having summarized the above explanation, the essential constitution of a wiring-inclusive structure in this embodiment is shown in FIG. 8.

This embodiment is premised on a wiring-inclusive structure which is so constituted that a via hole 2 and a wiring trench 3 are integrally formed in an interlayer insulation film 1 made of, for example, an allylether organic film with a low dielectric constant or the like, a wiring 4 formed by filling the via hole 2 and the wiring trench 3 with Cu via a base film 6 made of TaN, Ta, or the like is formed by a damascene method and a CMP method, and an SiC:H film 5 is formed to cover an upper surface of the wiring 4.

Then, the film density of the SiC:H film 5 is controlled to be 2.1 (g/cm$^3$) or higher by the addition of an N-containing gas at the time of forming the SiC:H film 5. From another point of view, the SiC:H film 5 is formed by controlling the added amount of the N-containing gas so as to make an N atom content of the SiC:H film 5 become 8 (atm %) to 20 (atm %). By these processes, wiring delay in the Cu wiring-inclusive structure formed by the damascene method is suppressed. In addition, an effective dielectric constant of the insulation film in which the wiring is filled and formed is greatly reduced, thereby realizing a highly reliable wiring-inclusive structure which responds to further microscopic formation of a semiconductor element in the near future.

Concrete Embodiment

Based on the above-described basic gist of the present invention, a concrete embodiment of the present invention will be explained in detail with reference to the drawings.

FIG. 9A and FIG. 9B to FIG. 14 are schematic sectional views showing a forming method of a wiring-inclusive structure according to this embodiment in the order of its processes.

Figure 9A:
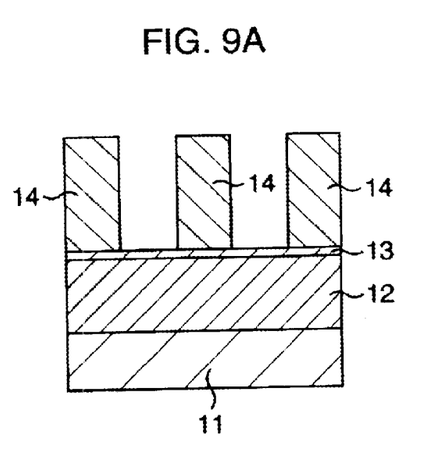
FIG. 9A and FIG. 9B are schematic sectional views showing a forming method of the wiring-inclusive structure according to this embodiment in the order of its processes.

First, as shown in FIG. 9A, after a semiconductor element (not shown) such as a MOS transistor is formed on a silicon substrate 11, an allylether organic film 12 with a low dielectric constant (film thickness 150 nm) is formed as an interlayer insulation film with a low dielectric constant. Subsequently, an anti-reflection film 13 for preventing reflection from a base is formed. Thereafter, a photo resist is applied on the anti-reflection film 13. This is processed by photolithography to form a resist pattern 14 in a wiring trench shape.

Incidentally, as the interlayer insulation film, the following may be formed instead of the allylether organic film 12 with a low dielectric constant: an SiO$_2$ film doped with fluorine, an aromatic hydrocarbon polymer film, a fluorocarbon film with a low dielectric constant, a hydrogen silses quioxane film with a low dielectric constant, a hydromethyl silses quioxane film with a low dielectric constant, a porous quioxane film with a low dielectric constant, an organosilicate glass film, and a porous allylether film with a low dielectric constant. It is also suitable to form as the interlayer insulation film a multilayered structure film which is constituted of a film having a low dielectric constant with a plasma SiO$_2$ film, a plasma SiON film, or a plasma SiN film.

Figure 9B:
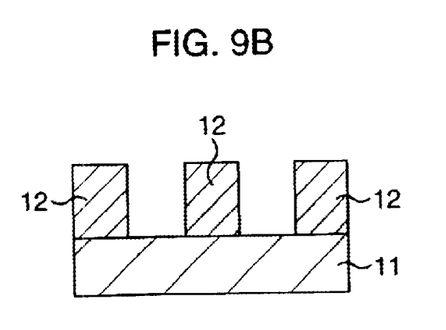

Subsequently, as shown in FIG. 9B, with the resist pattern 14 used as a mask, the anti-reflection film 13 and the allylether organic film 12 with a low dielectric constant are plasma-etched to form a wiring trench. Thereafter, the resist pattern 14 and anti-reflection film 13 which are not necessary are removed.

Figure 10A:
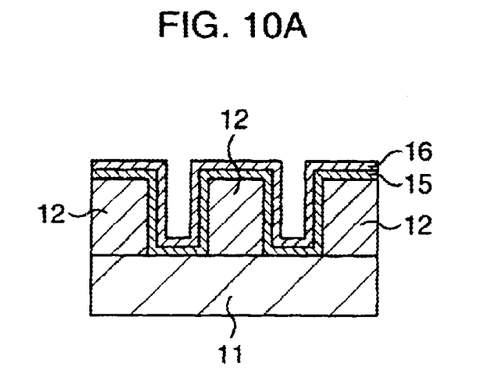
FIG. 10A, FIG. 10B, and FIG. 10C are schematic sectional views showing the forming method of the wiring-inclusive structure according to this embodiment in the order of its processes, subsequently to FIG. 9A and FIG. 9B.

Subsequently, as shown in FIG. 10A, a Ta film or a TaN film (film thickness 15 nm) is formed as a barrier metal film 15 by a sputtering method so as to cover an inner wall of the wiring trench. Next, a plating electrode film 16 (film thickness 130 nm) is formed on the barrier metal film 15.

Figure 10B:
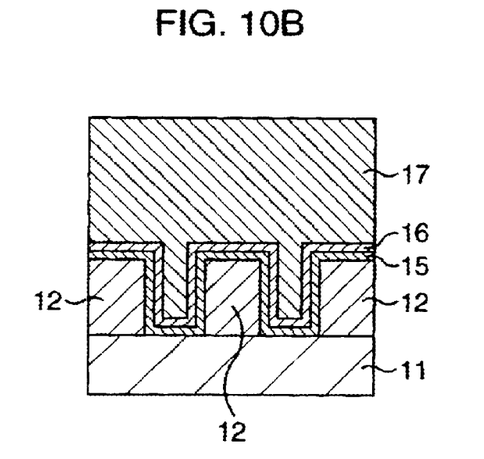
Figure 10C:
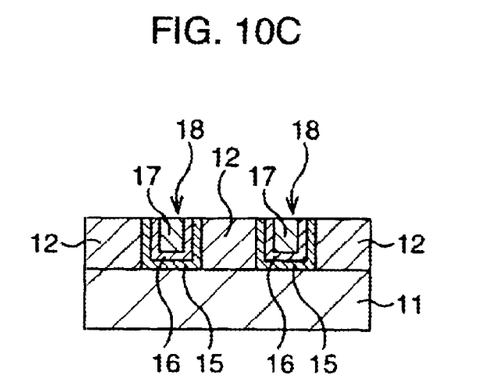

Subsequently, as shown in FIG. 10B, a Cu film 17 is formed to have a film thickness of 970 nm by an electric field plating method. Thereafter, as shown in FIG. 10C, the Cu film 17 and the barrier metal film 15 are polished by a CMP method to form a wiring 18 which is formed by filling the wiring trench with Cu via the barrier metal film 15.

Figure 11A:
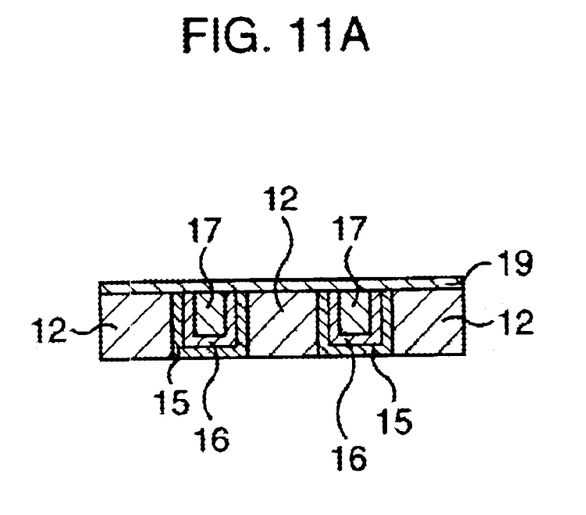
FIG. 11A and FIG. 11B are schematic sectional views showing the forming method of the wiring-inclusive structure according to this embodiment in the order of its processes, subsequently to FIG. 10A, FIG. 10B, and FIG. 10C.

Subsequently, as shown in FIG. 11A, an SiC:H film 19 (film thickness 70 nm) is formed on the wiring 18 by a plasma CVD method to have a film density of 2.2 (g/cm$^3$).

Concretely, 4Ms, 3MS, or 2MS is used as a source gas of carbon (C). NH$_3$ is added as an added gas. Then, a mixed gas plasma of these gases is used, and the film forming is carried out under the condition that the total pressure ranges from $1.3\times10^2$ (Pa) to $1.3\times10^1$ (Pa) (1 (Torr) to 10 (Torr)), a plasma power ranges from 300 (W) to 50 (W) at 13.56 (MHz) (or 300 (W) to 500 (W) at 400 (kHz)), and a film-forming temperature ranges from 350° C. to 400° C. At this time, the addition of the NH$_3$ gas produces a similar effect without applying an RF power of 400 (kHz). In this case, it is also suitable to add N2 instead of the NH$_3$ gas as the added gas.

Figure 11B:
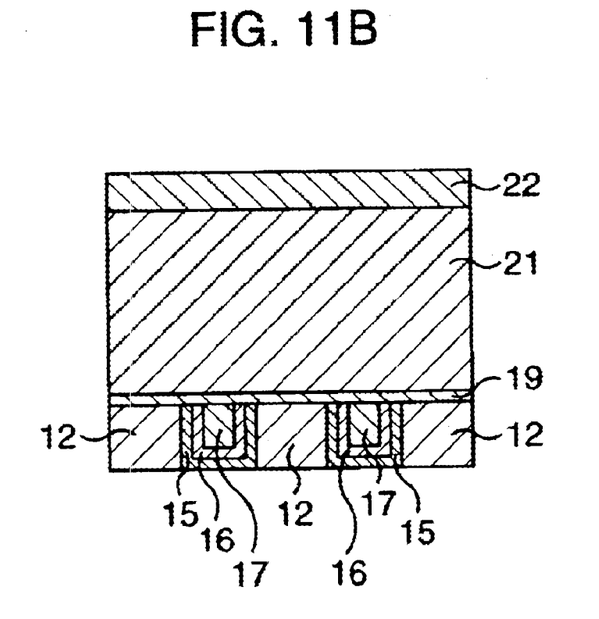

Subsequently, as shown in FIG. 11B, an allylether organic film 21 with a low dielectric constant (film thickness 550 nm) is formed. This allylether organic film 21 becomes an interlayer insulation film in forming a wiring part on the SiC:H film 19. Furthermore, an SiN film 22 (film thickness 100 nm) which is to serve as an etching mask in forming the wiring part is formed by a plasma CVD method.

Incidentally, as the interlayer insulation film, the following may be formed instead of the allylether organic film 21 with a low dielectric constant: an SiO$_2$ film doped with fluorine, an aromatic hydrocarbon polymer film, a fluorocarbon film with a low dielectric constant, a hydrogen silses quioxane film with a low dielectric constant, a hydromethyl silses quioxane film with a low dielectric constant, a porous quioxane film with a low dielectric constant, an organosilicate glass film, and a porous allylether film with a low dielectric constant. It is also suitable to form as the interlayer insulation film a multilayered structure film constituted of a film having a low dielectric constant with a plasma SiO$_2$ film, a plasma SiON film, or a plasma SiN film.

Figure 12A:
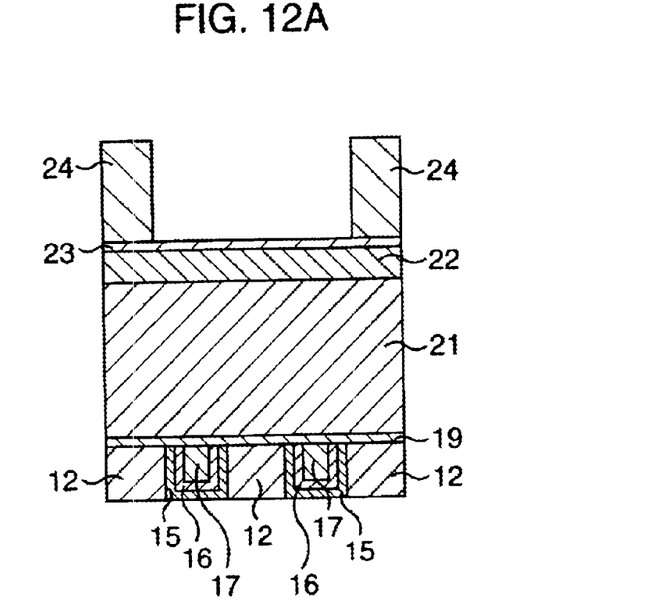
FIG. 12A and FIG. 12B are schematic sectional views showing the forming method of the wiring-inclusive structure according to this embodiment in the order of its processes, subsequently to FIG. 11A and FIG. 11B.

Subsequently, as shown in FIG. 12A, after an anti-reflection film 23 is formed on the SiN film 22, a photo resist is applied on this anti-reflection film 23. This is processed by photolithography to form a resist pattern 24 in a wiring trench shape.

Figure 12B:
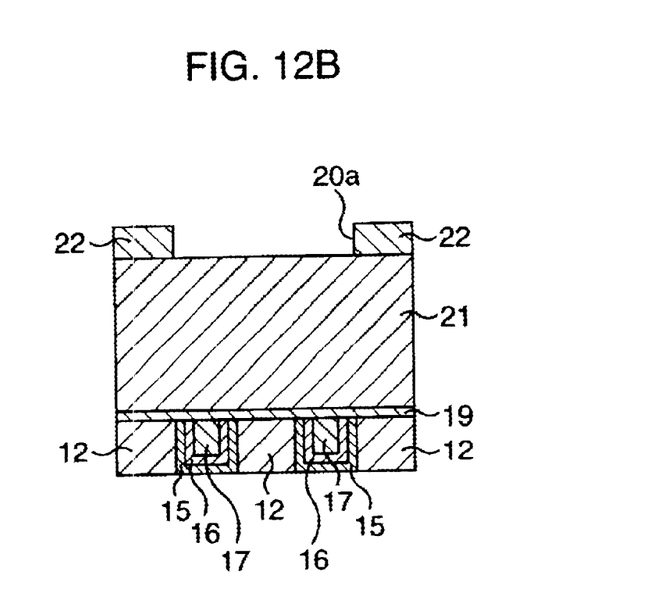

Subsequently, as shown in FIG. 12B, with the resist pattern 24 used as a mask, the anti-reflection film 23 and the SiN film 22 are plasma-etched to form a wiring trench pattern 20a in the SiN film 22. Thereafter, the resist pattern 24 and the anti-reflection film 23 which are not necessary are removed.

Figure 13A:
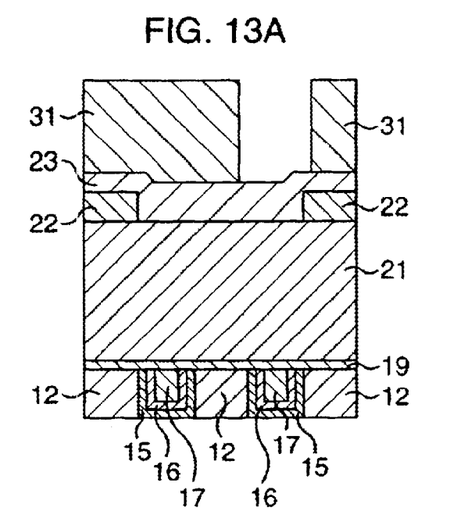
FIG. 13A, FIG. 13B, and FIG. 13C are schematic sectional views showing the forming method of the wiring-inclusive structure according to this embodiment in the order of its processes, subsequently to FIG. 12A and FIG. 12B.

Subsequently, as shown in FIG. 13A, after an anti-reflection film 23 (film thickness 110 nm) is formed on the SiN film 22 to fill the wiring trench pattern 20a, a photo resist is applied on this anti-reflection film 23. This is processed by photolithography to form a resist pattern 31 in a via-hole shape.

Figure 13B:
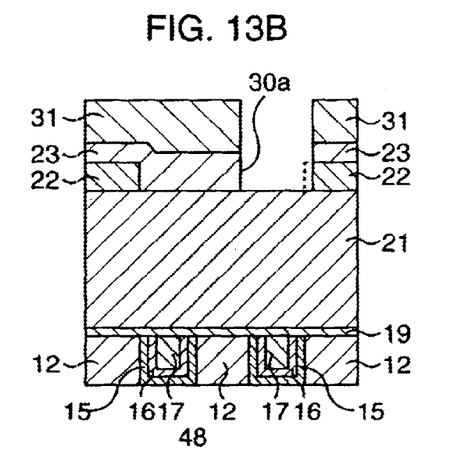
Figure 13C:
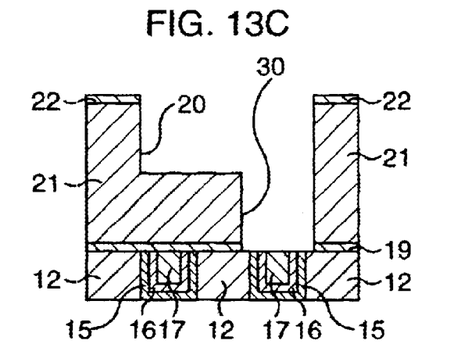

Subsequently, as shown in FIG. 13B, with the resist pattern 31 used as a mask, the anti-reflection film 23 and the SiN film 22 are plasma-etched. Furthermore, as shown in FIG. 13C, with the SiC:H film 19 used as a stopper, the allylether organic film 21 with a low dielectric constant is etched. Thereafter, the SiC:H film 19 is etched so as to expose the surface of the wiring 18. Through these processes, a wiring trench 20 integrated with a via hole 30 is formed, while the SiN film 22 in which the via hole 30 and the wiring trench pattern 20a are formed serves as a mask. Incidentally, the resist pattern 31 and the anti-reflection film 23 are removed by a series of these processes.

Figure 14:
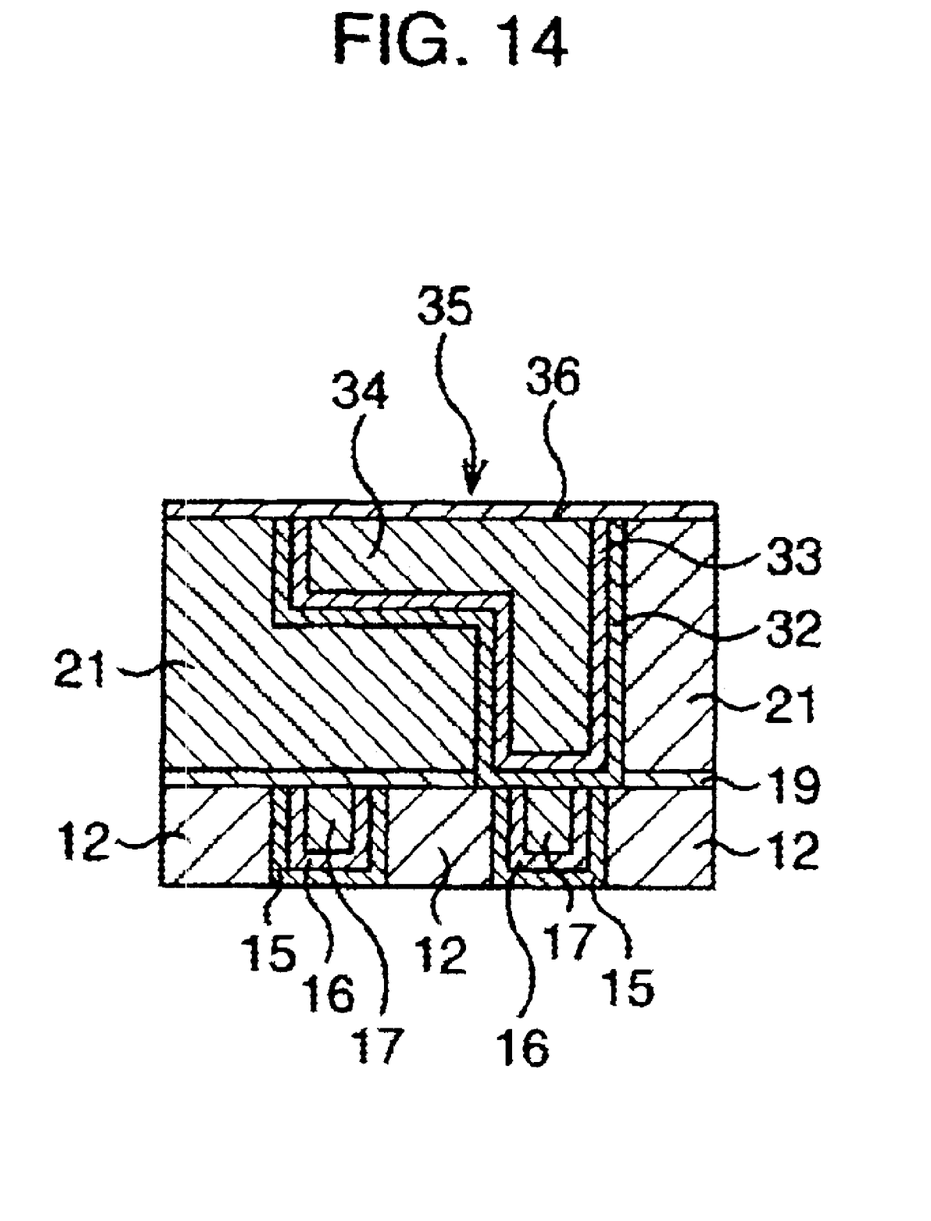
FIG. 14 is a schematic sectional view showing the forming method of the wiring-inclusive structure according to this embodiment in the order of its processes, subsequently from FIG. 13A, FIG. 13B and FIG. 13C.

Then, as shown in FIG. 14, a Ta film (film thickness 15 nm) is formed as a barrier metal film 32 by a sputtering method to cover an inner wall of the wiring trench 20 and the via hole 30. Next, a plating electrode film 33 (film thickness 130 nm) is formed on the barrier metal film 32. Thereafter, a Cu film 34 is formed by an electric field plating method to have a film thickness of 970 nm. Then, the Cu film 34 and the barrier metal film 32 are polished by a CMP method. At this time, a wiring 35 is formed which fills the via hole 30 and the wiring trench 20. Thereafter, an SiN film (film thickness 70 nm) to be a cover film 36 is formed on the wiring 35.

As a result of a temperature bias test on the wiring-inclusive structure having a so-called full low dielectric constant according to this embodiment in which the wiring part and a plug part constituting the wiring are formed in the film with a low dielectric constant, no defect is seen either in a temperature bias stress test as shown in the following Table 3. A favorable result that an inter-wiring capacity is reduced by 8% compared with a conventional invention without sacrificing the lifetime of the wiring is obtained.

TABLE 3

|  | conventional (using SiN) | conventional (using) conventional SiC) | present invention (using SiC of present invention) |
|---|---|---|---|
| inter-wiring capacity L/S = 0.2/0.2 μm | 170 fF/mm | 153 fF/mm | 158 fF/mm |
| lifetime of wiring 2 MV/cm, 200° C. | >1000 kh | <800 kh | >1000 kh |

As described above, according to this embodiment, wiring delay is suppressed and an effective dielectric constant of the interlayer insulation film in which the wiring 18 is filled and formed is greatly reduced in forming the wiring 18 of Cu through the use of the damascene method, thereby realizing a highly reliable wiring-inclusive structure which responds to further microscopic formation of a semiconductor element in the near future.

According to the present invention, wiring delay is suppressed and an effective dielectric constant of an insulation film in which a wiring is filled and formed is greatly reduced in forming a wiring of a conductive material having an easily diffusible property to an insulation film, which is represented by Cu, through the use of a damascene method, thereby realizing a highly reliable wiring-inclusive structure which responds to further microscopic formation of a semiconductor element in the near future.

The present embodiments are to be considered in all respects as illustrative and no restrictive, and all changes which come within the meaning and range of equivalency of the claims are therefore intended to be embraced therein. The invention may be embodied in other specific forms without departing from the sprit or essential characteristics thereof.

What is claimed is:

1. A wiring-inclusive structure, comprising:
   a substrate;
   an insulation film which is provided above said substrate and in which a wiring-shaped trench is formed; and
   a wiring which is formed by filling the trench with a conductive material having an easily diffusible property to said insulation film,
   wherein a diffusion preventive film which uses hydrogenated SiC as its material and has a film density of 2.1 (g/cm$^3$) or higher is provided to cover an upper surface of said wiring.

2. The wiring-inclusive structure according to claim 1, wherein the diffusion preventive film contains 8 (atm %) to 20 (atm %) of N atoms.

3. The wiring-inclusive structure according to claim 1, wherein the conductive material forming said wiring is a metal material containing at least Cu.

4. The wiring-inclusive structure according to claim 1, wherein said wiring is filled in the trench via a conductive base film.

5. The wiring-inclusive structure according to claim 1, wherein said insulation film is comprised of a material with a low dielectric constant.

6. A wiring-inclusive structure, comprising:
   a substrate;
   an insulation film which is provided above said substrate and in which a wiring-shaped trench is formed; and
   a wiring formed by filling the trench with a conductive material having an easily diffusible property to said insulation film,
   wherein a diffusion preventive film which uses hydrogenated SiC as its material and contains 8 (atm %) to 20 (atm %) of N atoms is provided to cover an upper surface of said wiring.

7. The wiring-inclusive structure according to claim 6, wherein the conductive material forming said wiring is a metal material containing at least Cu.

8. The wiring-inclusive structure according to claim 6, wherein said wiring is filled in the trench via a conductive base film.

9. The wiring-inclusive structure according to claim 6, wherein said insulation film is comprised of a material with a low dielectric constant.

10. A forming method of a wiring-inclusive structure, comprising the steps of:
    forming at least a wiring-shaped trench in an insulation film;
    filling the trench with a conductive material having an easily diffusible property at least to the insulation film to form a wiring;
    forming a diffusion preventive film by using hydrogenated SiC as its material to cover an upper surface of the wiring and to have a film density of 2.1 (g/cm$^3$) or higher.

11. The forming method of the wiring-inclusive structure according to claim 10, wherein, in said step of forming the diffusion preventive film, an N-containing gas is added to the diffusion preventive film and an N concentration in the diffusion preventive film is controlled to be 8 (atm %) to 20 (atm %).

12. The forming method of the wiring-inclusive structure according to claim 10, wherein a source gas used in said step of forming the diffusion preventive film is a methylsilane gas.

13. The forming method of the wiring-inclusive structure according to claim 11, wherein the N-containing gas is $N_2$ or $NH_3$.

14. The forming method of the wiring-inclusive structure according to claim 10, wherein the conductive material forming the wiring is a metal material which includes at least Cu.

15. The forming method of the wiring-inclusive structure according to claim 10, wherein, in said step of forming the wiring, a conductive base film is formed to cover an inner wall of the trench, and thereafter, the wiring is formed to fill the trench via the base film.

16. The forming method of the wiring-inclusive structure according to claim 10, wherein the insulation film is comprised of a material with a low dielectric constant.

17. A method of forming a wiring-inclusive structure, comprising the steps of:

forming at least a wiring-shaped trench in an insulation film;

filling the trench with a conductive material having an easily diffusible property at least to the insulation film to form a wiring; and forming a diffusion preventive film by using hydrogenated SiC as its material to cover an upper surface of the wiring, wherein, in said step of forming the diffusion preventive film, an N-containing gas is added into the diffusion preventive film and an N concentration in the diffusion preventive film is controlled to be 8 (atm %) to 20 (atm %).

18. The forming method of the wiring-inclusive structure according to claim 17, wherein a source gas used in said step of forming the diffusion preventive film is a methylsilane gas.

19. The forming method of the wiring-inclusive structure according to claim 17, wherein the N-containing gas is $N_2$ or $NH_3$.

20. The forming method of the wiring-inclusive structure according to claim 17, wherein the conductive material forming the wiring is a metal material containing at least Cu.

21. The forming method of the wiring-inclusive structure according to claim 17, wherein, in said step of forming the wiring, a conductive base film is formed to cover an inner wall of the trench, and thereafter, the wiring is formed to fill the trench via the base film.

22. The forming method of the wiring-inclusive structure according to claim 17, wherein the insulation film is comprised of a material with a low dielectric constant.

* * * * *